US011191162B2

(12) United States Patent
Watanabe

(10) Patent No.: US 11,191,162 B2
(45) Date of Patent: Nov. 30, 2021

(54) CIRCUIT BOARD SUPPORTING STRUCTURE AND LIGHT EMITTING DEVICE HAVING THE SAME

(71) Applicant: Hoya Candeo Optronics Corporation, Toda (JP)

(72) Inventor: Hiroaki Watanabe, Toda (JP)

(73) Assignee: HOYA CORPORATION, Tokyo (JP)

( * ) Notice: Subject to any disclaimer, the term of this patent is extended or adjusted under 35 U.S.C. 154(b) by 106 days.

(21) Appl. No.: 16/579,267

(22) Filed: Sep. 23, 2019

(65) Prior Publication Data
US 2020/0214133 A1 Jul. 2, 2020

(30) Foreign Application Priority Data

Dec. 29, 2018 (JP) .............................. JP2018-248769

(51) Int. Cl.
H01L 25/13 (2006.01)
H05K 1/18 (2006.01)
H05K 1/02 (2006.01)
H01L 33/64 (2010.01)

(52) U.S. Cl.
CPC ............... H05K 1/18 (2013.01); H01L 25/13 (2013.01); H01L 33/644 (2013.01); H05K 1/0203 (2013.01); H01L 33/648 (2013.01); H05K 2201/064 (2013.01); H05K 2201/066 (2013.01); H05K 2201/10106 (2013.01); H05K 2201/10265 (2013.01); H05K 2201/10522 (2013.01); H05K 2201/209 (2013.01)

(58) Field of Classification Search
None
See application file for complete search history.

(56) References Cited

U.S. PATENT DOCUMENTS 7,582,959 B2 * 9/2009 Fukusako ............ H05K 1/0204
257/668
2013/0141913 A1 * 6/2013 Sachsenweger ....... H05K 3/325
362/249.02
2020/0077516 A1 * 3/2020 Klingler ................. H05K 3/363

FOREIGN PATENT DOCUMENTS

JP 2015028915 A 2/2015

* cited by examiner

Primary Examiner — Dung A. Le
(74) Attorney, Agent, or Firm — Rabin & Berdo, P.C.

(57) ABSTRACT

Provided is a circuit board supporting structure capable of easily detaching a circuit board on a base. The circuit board supporting structure is configured to support a circuit board on a base, in which the base has a concave portion formed in a placement surface of the circuit board, and a rotational operation member configured to be rotatably accommodated in the concave portion and extend and retract in a direction perpendicular to the placement surface by a rotational operation, in which the circuit board has a through hole formed at a position corresponding to the concave portion, in which the rotational operation member has a reference surface formed approximately in parallel with the placement surface, and an operation portion formed on a rotational axis of the rotational operation member so as to be exposed from the through hole.

20 Claims, 7 Drawing Sheets

CIRCUIT BOARD SUPPORTING STRUCTURE AND LIGHT EMITTING DEVICE HAVING THE SAME

TECHNICAL FIELD

The present disclosure relates to a circuit board supporting structure configured to support a circuit board on a base (e.g., a heat sink or a base plate), and particularly, to a circuit board supporting structure capable of easily changing circuit boards, and a light emitting device having the same.

BACKGROUND ART

In the related art, ultraviolet curable ink, which is cured by being irradiated with ultraviolet rays, is used as ink for sheet-fed offset printing. In addition, ultraviolet curable resin is used as a sealing agent for a flat panel display (FPD) such as a liquid crystal panel or an organic EL (electroluminescence) panel. In general, a light emitting device configured to emit ultraviolet rays is used to cure the ultraviolet curable ink or the ultraviolet curable resin (for example, Patent Document 1).

The light emitting device disclosed in Patent Document 1 has a heat sink and multiple light source modules fixed onto the heat sink. Multiple LED elements are mounted on a board of the light source module, and thermal grease is applied between the board of the light source module and the heat sink to fix the board of the light source module and the heat sink, thereby efficiently transferring heat generated from the light source module to the heat sink.

DOCUMENT OF RELATED ART

Patent Document 1

Japanese Patent Application Laid-Open No. 2015-28915

DISCLOSURE

Technical Problem

However, in the case of the light emitting device disclosed in Patent Document 1, the light source module may be efficiently cooled, but because adhesion between the board of the light source module and the heat sink is strong, there is a problem in that it is difficult to detach the light source module in a case in which the light source module needs to be changed such as in the event of a failure of the light source module. In addition, in general, in the case of the light emitting device, optical components such as a reflecting mirror are often disposed at the periphery of the light source module, and a process of changing the light source module needs to be performed in a narrow space, and as a result, there is a need for a configuration that enables the process of changing the light source module to be easily performed.

The present disclosure has been made in consideration of the above-mentioned circumstances, and an object of the present disclosure is to provide a circuit board supporting structure capable of easily detaching a circuit board (a light source module or the like) on a base (a heat sink or the like). In addition, another object of the present disclosure is to provide a light emitting device having the circuit board supporting structure.

Technical Solution

To achieve the above-mentioned objects, a circuit board supporting structure according to the present invention is configured to support a circuit board on a base, in which the base has a concave portion formed in a placement surface of the circuit board, and a rotational operation member configured to be rotatably accommodated in the concave portion and extend and retract in a direction perpendicular to the placement surface by a rotational operation, in which the circuit board has a through hole formed at a position corresponding to the concave portion, in which the rotational operation member has a reference surface formed approximately in parallel with the placement surface, and an operation portion formed on a rotational axis of the rotational operation member so as to be exposed from the through hole, and in which by the rotational operation toward the operation portion, the reference surface is positioned on approximately the same plane as the placement surface or moved between a first state in which the reference surface is further recessed than the placement surface and a second state in which the reference surface further protrudes than the placement surface.

According to the configuration, in the second state, the reference surface comes into contact with the circuit board, and stress is applied in the direction perpendicular to the circuit board, such that the circuit board is raised from the base. Therefore, the circuit board is easily detached in the case in which the circuit board needs to be changed such as in the event of a failure of the circuit board.

In addition, the operation portion may be formed on approximately the same plane as the reference surface.

In addition, the rotational operation member may have a head portion having the reference surface and the operation portion, and a body portion configured to engage with or be thread-coupled to the concave portion. In addition, in this case, the head portion may have a protruding portion protruding from the reference surface along a rotational axis of the rotational operation member, and the protruding portion may be fitted into the through hole. In addition, the operation portion may be formed at a tip of the protruding portion. According to the configuration, the circuit board may be positioned by the protruding portion.

In addition, the rotational operation member may have a compressive spring configured to bias the circuit board in a direction perpendicular to the reference surface in the second state.

In addition, the base may be a heat sink configured to cool the circuit board.

In addition, from another point of view, a light emitting device of the present disclosure may include any one of the circuit board supporting structures, and multiple light emitting elements disposed on the circuit board. In addition, in this case, light emitted from the light emitting element may be light having a wavelength in an ultraviolet region.

Advantageous Effects

As described above, according to the present disclosure, the circuit board supporting structure capable of easily detaching the circuit board on the base is implemented. In addition, the light emitting device having the circuit board supporting structure is implemented.

Figure 1:
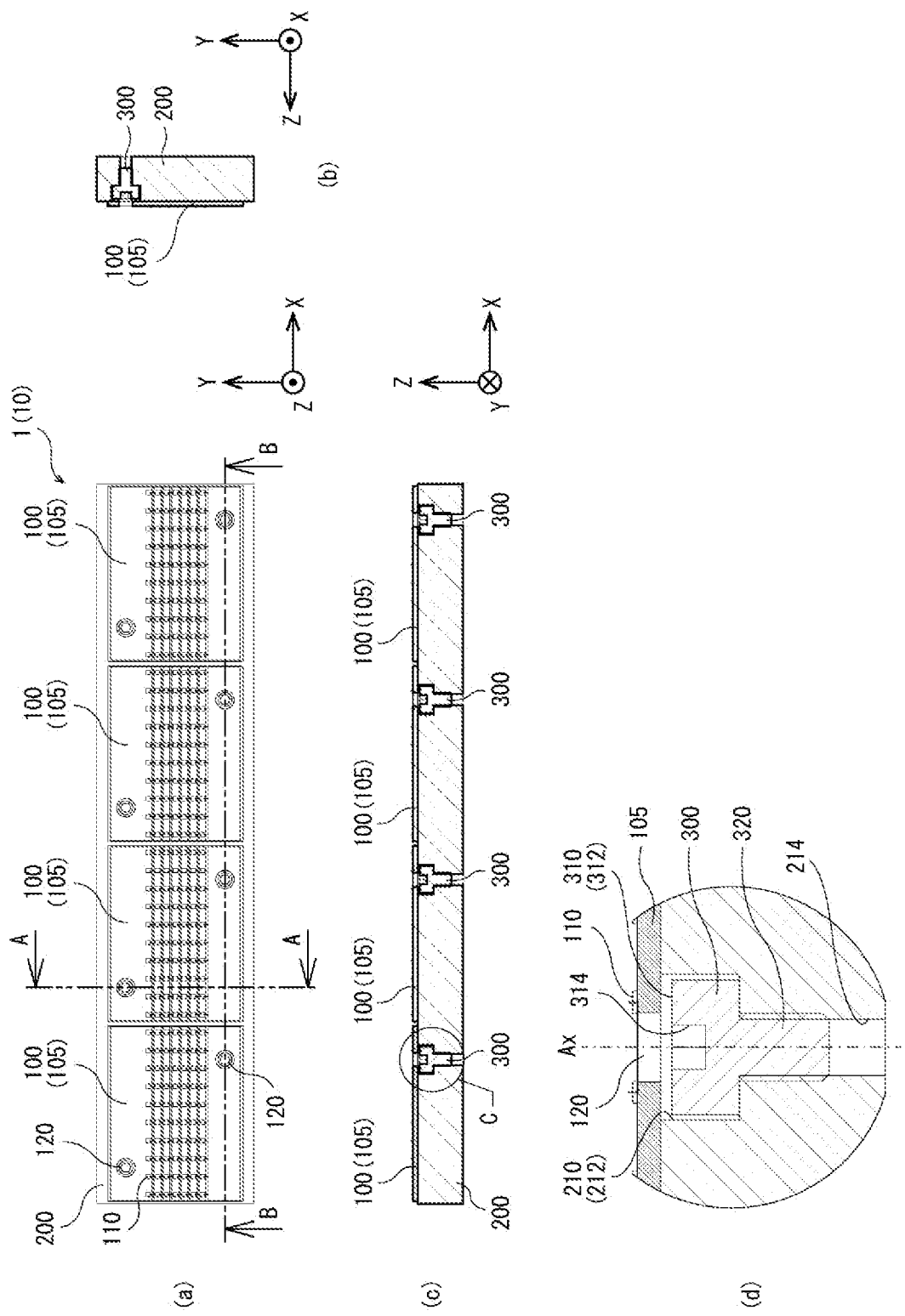
FIG. 1 is a view for explaining a schematic configuration of a light emitting device having a circuit board supporting structure according to a first exemplary embodiment of the present disclosure.

DESCRIPTION OF MAIN REFERENCE
NUMERALS OF DRAWINGS 1, 2, 3: Light emitting device
10, 20, 30: Circuit board supporting structure
100: LED module
105: Board
110: LED element
120: Through hole
200, 200B: Heat sink
210, 210B: Concave portion
212: Expanded diameter portion
214: Thread-coupling portion
215B: Groove portion
216B: Bottom surface
217B: Small diameter portion
218B: Large diameter portion
219B: Stepped portion
300, 300A, 300B: Rotational operation member
310, 310A, 310B: Head portion
311A: Base portion
312, 312A, 312B: Reference surface
313A: Protruding portion
314, 314A, 314B: Tool hole
320, 320A: Body portion
320B: Cylindrical surface
325B: Protruding portion
327B: Concave portion
400: Compressive spring
Ax: Rotational axis

DETAILED DESCRIPTION

Hereinafter, exemplary embodiments of the present disclosure will be described in detail with reference to the drawings. Further, in the drawings, identical or equivalent constituent elements are denoted by the same reference numerals, and descriptions thereof will be omitted.

First Exemplary Embodiment

FIG. 1 is a view for explaining a schematic configuration of a light emitting device 1 having a circuit board supporting structure 10 according to a first exemplary embodiment of the present disclosure, in which FIG. 1A is a front view, FIG. 1B is a cross-sectional view taken along line A-A in FIG. 1A, FIG. 1C is a cross-sectional view taken along line B-B in FIG. 1A, and FIG. 1D is an enlarged view of part C in FIG. 1C.

The light emitting device 1 of the present exemplary embodiment is a light source device mounted on a printing device or the like and configured to cure ultraviolet curable ink or ultraviolet curable resin. For example, the light emitting device 1 is disposed above a target object so that a front side of the light emitting device 1 (a side at which LED modules 100 are disposed) is directed toward the target object, and the light emitting device 1 emits ultraviolet rays downward toward the target object. Further, in the present specification, as illustrated in FIG. 1, the description will be made assuming that a direction in which a light emitting diode (LED) element 110 emits ultraviolet rays is defined as a Z-axis direction, a longitudinal direction of the light emitting device 1 is defined as an X-axis direction, and a direction (a transverse direction of the light emitting device 1) orthogonal to the Z-axis direction and the X-axis direction is defined as a Y-axis direction. In addition, in general, the ultraviolet ray is considered as meaning light having a wavelength of 400 nm or less. However, in the present specification, the ultraviolet ray means light having a wavelength (e.g., a wavelength of 250 to 420 nm) capable of curing the ultraviolet curable ink.

As illustrated in FIG. 1, the light emitting device 1 of the present exemplary embodiment has four LED modules 100, a heat sink (base) 200, and a box-shaped casing (not illustrated) made of metal and configured to accommodate the LED modules 100 and the heat sink 200.

The LED module 100 has a board 105 (circuit board) having a rectangular shape defined in the X-axis direction and the Y-axis direction, and multiple LED elements (light emitting elements) 110 on the board 105, and the four LED modules 100 are disposed and fixed on one end surface of the heat sink 200 (see FIG. 1A). For example, the board 105 is a ceramic board made of aluminum nitride having high thermal conductivity, and in each of the boards 105, two through holes 120 are formed at positions corresponding to concave portions 210 formed in the heat sink 200. Further, in the present exemplary embodiment, thermal grease (not illustrated) is applied onto a surface (placement surface) of the heat sink 200, and the board 105 is then mounted on the heat sink 200, such that the thermal grease is interposed between a rear surface of the board 105 and the heat sink 200 to increase adhesion between the board 105 and the heat sink 200.

The LED module 100 has the 70 LED elements 110 disposed on the board 105 in a mode of 7 rows (Y-axis direction)×10 LED elements (X-axis direction). The 70 LED elements 110 are disposed on the surface of the board 105 in a state in which optical axes thereof are aligned with the Z-axis direction. An anode pattern (not illustrated) and a cathode pattern (not illustrated) are formed on the surface of the board 105 to supply electric power to each of the LED elements 110. Each of the LED elements 110 is electrically connected to one end of the anode pattern and one end of the cathode pattern by soldering (e.g., by a conductive adhesive (silver paste), a brazing material, welding, fusion welding, diffusion bonding, or the like). The anode pattern and the cathode pattern are electrically connected to a non-illustrated driver circuit, and a drive current is supplied from the driver circuit to each of the LED elements 110. When the drive current is supplied to each of the LED elements 110, the ultraviolet rays (having a wavelength of 385 nm, for example) corresponding in light amount to the drive current are emitted from each of the LED elements 110. Further, the drive current to be supplied to each of the LED elements 110 is adjusted so that each of the LED elements 110 of the present exemplary embodiment emits the ultraviolet rays with approximately the same light amount, and the ultraviolet rays emitted from the light emitting device 1 have approximately uniform light intensity distributions in the X-axis direction and the Y-axis direction.

The heat sink 200 is a member configured to dissipate heat generated from each of the LED modules 100, and the heat sink 200 is installed such that the surface of the heat sink 200 adjoins the rear surface of the board 105 of each of the LED modules 100. The heat sink 200 is made of metal such as copper having high thermal conductivity, and multiple channels (not illustrated) through which a refrigerant (coolant) passes are formed in the heat sink 200.

As described above, in the present exemplary embodiment, the thermal grease is applied between the rear surface of the board 105 and the heat sink 200 to increase adhesion. However, the board 105 adheres to the heat sink 200 when the light emitting device is used over a long period time, and as a result, there is a problem in that it is difficult to detach the LED module 100 in a case in which the LED module 100 needs to be changed such as in the event of a failure of the LED module 100. In addition, in general, in the case of the light emitting device 1, there is a problem in that it is difficult to perform the process of changing the LED module 100 because optical components such as a reflecting mirror (not illustrated) are often disposed at the periphery of the LED module 100 and the process of changing the LED module 100 needs to be performed in a narrow space. Therefore, in the present exemplary embodiment, the problems are solved by configuring the circuit board supporting structure 10 with the respective boards 105 and the heat sink 200. Specifically, the two through holes 120 are formed in each of the boards 105, the concave portions 210 each having a circular shape in a plan view are formed at the positions corresponding to the through holes 120 of the heat sink 200, and rotational operation members 300 are disposed in the concave portions 210, respectively (FIG. 1D).

Figure 2:
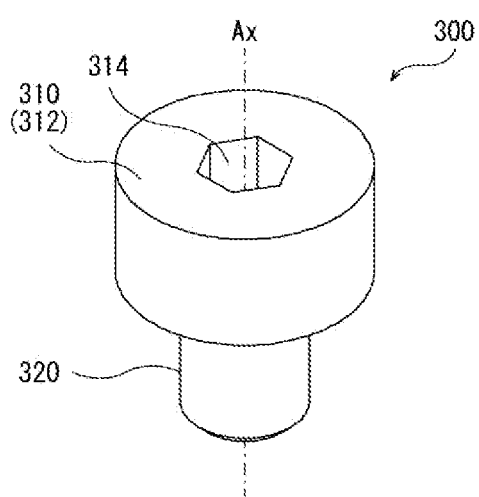
FIG. 2 is a perspective view for explaining a configuration of a rotational operation member of the circuit board supporting structure according to the first exemplary embodiment of the present disclosure.

FIG. 2 is a perspective view for explaining a configuration of the rotational operation member 300 of the present exemplary embodiment. As illustrated in FIG. 2, the rotational operation member 300 is a member made of metal and having a cross section having an approximately T shape (FIG. 1D). The rotational operation member 300 is rotatably accommodated in the concave portion 210 and configured to extend and retract in a direction (i.e., the Z-axis direction) perpendicular to the surface of the heat sink 200 by rotating about a rotational axis Ax extending in the Z-axis direction. The rotational operation member 300 has a columnar head portion 310 positioned at a side adjacent to the surface of the heat sink 200, and a columnar body portion 320 positioned closer to the inside of the heat sink 200 than the head portion 310 to the inside of the heat sink 200. An outer diameter of the head portion 310 is greater than an outer diameter of the body portion 320, and a circumferential surface of the body portion 320 has a threaded portion (not illustrated). In addition, at a tip of the head portion 310, a reference surface 312 is formed approximately in parallel with the surface of the heat sink 200, and a tool hole (operation portion) 314 is formed on the rotational axis Ax of the rotational operation member 300. Further, as illustrated in FIG. 2, the tool hole 314 is illustrated as being a hexagonal hole, but the tool hole 314 may be a groove such as a "−" groove or a "+" groove suitable for a tool such as a screw driver.

Further, the concave portion 210 of the heat sink 200 has an expanded diameter portion 212 configured to accommodate the head portion 310 of the rotational operation member 300, and a thread-coupling portion 214 having a threaded portion (not illustrated) thread-coupled to the body portion 320 of the rotational operation member 300. When the rotational operation member 300 is mounted in the concave portion 210 (i.e., when the rotational operation member 300 is thread-coupled to the concave portion 210), the reference surface 312 is positioned on approximately the same plane as the surface (placement surface) of the heat sink 200 or the reference surface 312 is further recessed than the surface of the heat sink 200 (first state) (FIG. 1D). In this way, the light emitting device 1 of the present exemplary embodiment is assembled in the state in which the rotational operation member 300 is mounted in the concave portion 210. That is, the heat sink 200, in which the rotational operation member 300 is mounted in the concave portion 210, is prepared, the thermal grease is applied onto the surface (placement surface) of the heat sink 200, and the respective LED modules 100 are mounted on the heat sink 200 and fixed by a non-illustrated fixing member (e.g., a screw or the like). When the LED modules 100 are mounted on the heat sink 200, the through hole 120 of each of the boards 105 is disposed above (at a side in the Z-axis direction of) each of the concave portions 210 of the heat sink 200, and the tool hole 314 of the rotational operation member 300 is exposed from the through hole 120. Further, in the present exemplary embodiment, the diameter of the through hole 120 is smaller than the diameter of the expanded diameter portion 212 of the concave portion 210 and the diameter of the head portion 310 of the rotational operation member 300.

Further, after the light emitting device 1 begins to be used, for example, in the case in which the process of changing the LED module 100 needs to be performed in the event of a failure of the LED element 110, the non-illustrated fixing member (e.g., a screw or the like), which fixes the respective LED modules 100, is detached, the tool (e.g., a screw driver or the like) is inserted into the through hole 120, and the tip of the tool is fitted into the tool hole 314 of the rotational operation member 300. Further, the rotational operation member 300 is rotated in a direction (counterclockwise direction) opposite to the mounting direction, such that the rotational operation member 300 is moved in the Z-axis direction. When the rotational operation member 300 is moved in the Z-axis direction, the reference surface 312 of the rotational operation member 300 comes into contact with the rear surface of the board 105, and the reference surface 312 further protrudes than the surface (placement surface) of the heat sink 200 (second state). Further, because stress in the Z-axis direction is applied to the board 105 when the reference surface 312 further protrudes than the surface (placement surface) of the heat sink 200, the board 105 is raised from the heat sink 200. That is, because the board 105 is lifted from the heat sink 200, the LED module 100 may be easily changed.

In this way, in the present exemplary embodiment, the rotational operation member 300 is accommodated in the concave portion 210 of the heat sink 200, and as the rotational operation member 300 is rotated about the rotational axis Ax, the reference surface 312 is positioned on approximately the same plane as the surface (placement surface) of the heat sink 200 or moved between the state (first state) in which the reference surface is further recessed than the surface of the heat sink 200 and the state (second state) in which the reference surface 312 further protrudes than the surface (placement surface) of the heat sink 200, such that the board 105 is raised from the heat sink 200, and as a result, the LED module 100 may be easily changed.

While the present exemplary embodiment has been described above, the present disclosure is not limited to the above-mentioned configurations, and various modifications may be made within the scope of the technical spirit of the present disclosure.

For example, in the present exemplary embodiment, the light emitting device 1 is described as having the circuit board supporting structure 10, but the use of the circuit board supporting structure 10 is not limited thereto, and the circuit board supporting structure 10 may be applied to a device having a configuration in which the circuit board is supported on the base (e.g., the heat sink or the base plate).

In addition, in the rotational operation member 300 of the present exemplary embodiment, the outer diameter of the head portion 310 is described as being greater than the outer diameter of the body portion 320, but the outer diameter of the head portion 310 and the outer diameter of the body portion 320 may be equal to each other.

In addition, the light emitting device 1 of the present exemplary embodiment is described as being configured to emit the ultraviolet rays, but the present disclosure is not limited to the configuration, and the present disclosure may be applied to a light source device configured to emit visible light or infrared light.

Second Exemplary Embodiment

Figure 3:
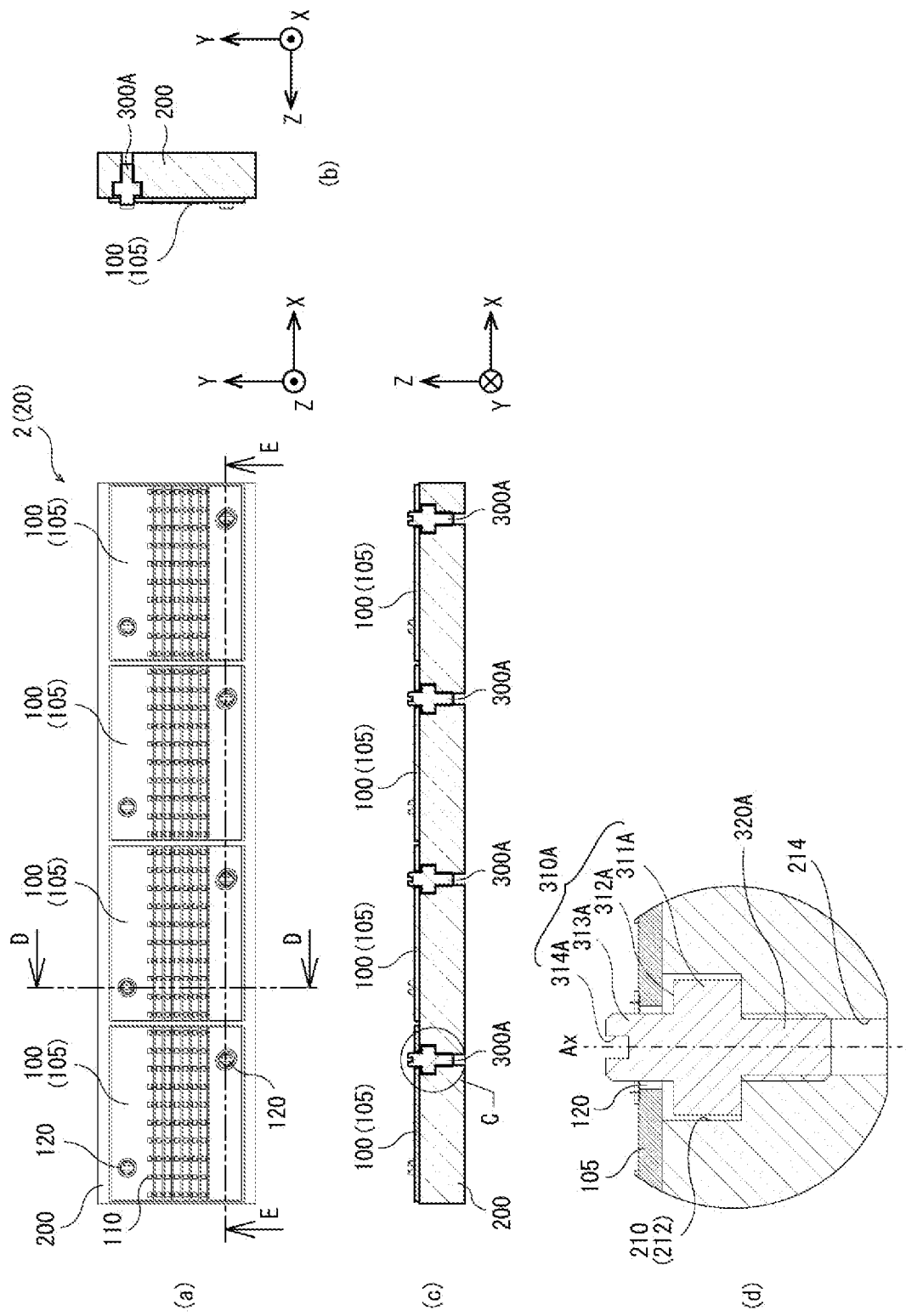
FIG. 3 is a view for explaining a schematic configuration of a light emitting device having a circuit board supporting structure according to a second exemplary embodiment of the present disclosure.

FIG. 3 is a view for explaining a schematic configuration of a light emitting device 2 having a circuit board supporting structure 20 according to a second exemplary embodiment of the present disclosure, in which FIG. 3A is a front view, FIG. 3B is a cross-sectional view taken along line D-D in FIG. 3A, FIG. 3C is a cross-sectional view taken along line E-E in FIG. 3A, and FIG. 3D is an enlarged view of part F in FIG. 3C. In addition, FIG. 4 is a perspective view for explaining a configuration of a rotational operation member 300A of the present exemplary embodiment.

Figure 4:
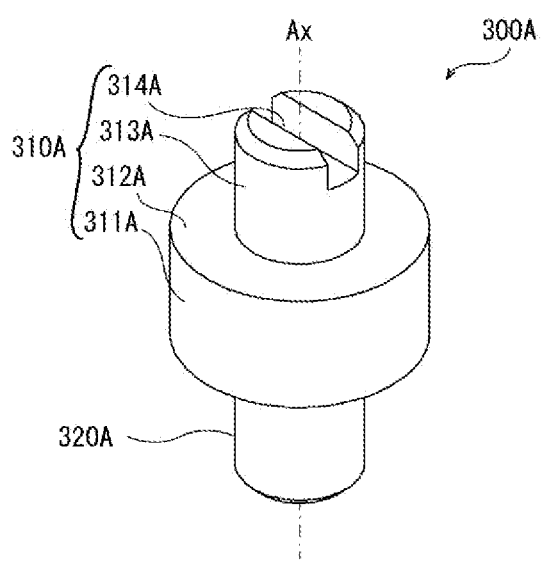
FIG. 4 is a perspective view for explaining a configuration of a rotational operation member of the circuit board supporting structure according to the second exemplary embodiment of the present disclosure.

As illustrated in FIGS. 3 and 4, the circuit board supporting structure 20 of the present exemplary embodiment differs from the circuit board supporting structure 10 of the first exemplary embodiment in that a shape of the rotational operation member 300A differs from the shape of the rotational operation member 300 of the first exemplary embodiment.

The rotational operation member 300A of the present exemplary embodiment is a member made of metal and having a cross section having an approximately '+' shape (FIG. 3D). Like the rotational operation member 300 of the first exemplary embodiment, the rotational operation member 300A is configured to extend and retract in a direction (i.e., the Z-axis direction) perpendicular to the surface of the heat sink 200 by rotating about the rotational axis Ax extending in the Z-axis direction. The rotational operation member 300A has a head portion 310A positioned at a side adjacent to the heat sink 200, and a columnar body portion 320A positioned closer to the inside of the heat sink 200 than the head portion 310A to the inside of the heat sink 200. The head portion 310A of the rotational operation member 300A of the present exemplary embodiment has a columnar base portion 311A accommodated in the expanded diameter portion 212 of the concave portion 210, and a columnar protruding portion 313A configured to protrude from the base portion 311A along the rotational axis Ax in the Z-axis direction. At an end surface in the Z-axis direction of the base portion 311A, a reference surface 312A is formed approximately in parallel with the surface of the heat sink 200. At an end surface in the Z-axis direction of the protruding portion 313A, a tool hole (operation portion) 314A is formed on the rotational axis Ax of the rotational operation member 300A. An outer diameter of the base portion 311A is greater than an outer diameter of the protruding portion 313A and an outer diameter of the body portion 320, and a circumferential surface of the body portion 320 has a threaded portion (not illustrated). In addition, an outer shape of the protruding portion 313A is slightly smaller than an inner diameter of the through hole 120 of the board 105, and the protruding portion 313A is fitted with the through hole 120 when the LED module 100 is mounted on the heat sink 200.

When the rotational operation member 300A of the present exemplary embodiment is mounted in the concave portion 210 (i.e., when the rotational operation member 300A is thread-coupled to the concave portion 210), the reference surface 312A is positioned on approximately the same plane as the surface (placement surface) of the heat sink 200, or the reference surface 312A is further recessed than the surface of the heat sink 200 (first state), and the protruding portion 313A protrudes from the surface of the heat sink 200 in the Z-axis direction (FIG. 3D). In this way, the light emitting device 2 of the present exemplary embodiment is assembled in the state in which the rotational operation member 300A is mounted in the concave portion 210. That is, the heat sink 200, in which the rotational operation member 300A is mounted in the concave portion 210, is prepared, the thermal grease is applied onto the surface (placement surface) of the heat sink 200, and the respective LED modules 100 are mounted on the heat sink 200 and fixed by a non-illustrated fixing member (e.g., a screw or the like). Further, in the present exemplary embodiment, since the protruding portion 313A protrudes from the surface of the heat sink 200 in the Z-axis direction when the LED module 100 is mounted, the protruding portion 313A is fitted with the through hole 120, and each of the LED modules 100 is positioned by the protruding portion 313A. Further, when the LED module 100 is mounted on the heat sink 200, the protruding portion 313A protrudes from the through hole 120, and the tool hole 314A of the rotational operation member 300A is also exposed from the through hole 120.

Further, after the light emitting device 2 begins to be used, for example, in the case in which the process of changing the LED module 100 needs to be performed in the event of a failure of the LED element 110, the non-illustrated fixing member (e.g., a screw or the like), which fixes the respective LED modules 100, is detached, and the tip of the tool (e.g., a screw driver or the like) is fitted into the tool hole 314A of the rotational operation member 300A. Further, the rotational operation member 300A is rotated in a direction (counterclockwise direction) opposite to the mounting direction, such that the rotational operation member 300A is moved in the Z-axis direction. When the rotational operation member 300A is moved in the Z-axis direction, the reference surface 312A of the rotational operation member 300A comes into contact with the rear surface of the board 105, and the reference surface 312A further protrudes than the surface (placement surface) of the heat sink 200 (second state). Further, because stress in the Z-axis direction is applied to the board 105 when the reference surface 312A further protrudes than the surface (placement surface) of the heat sink 200, the board 105 is raised from the heat sink 200.

That is, because the board 105 is lifted from the heat sink 200, the LED module 100 may be easily changed.

In this way, even in the present exemplary embodiment, like the first exemplary embodiment, as the rotational operation member 300A is rotated about the rotational axis Ax, the reference surface 312A is positioned on approximately the same plane as the surface (placement surface) of the heat sink 200 or moved between the state (first state) in which the reference surface is further recessed than the surface of the heat sink 200 and the state (second state) in which the reference surface 312A further protrudes than the surface (placement surface) of the heat sink 200, such that the board 105 is raised from the heat sink 200, and as a result, the LED module 100 may be easily changed.

Third Exemplary Embodiment

Figure 5:
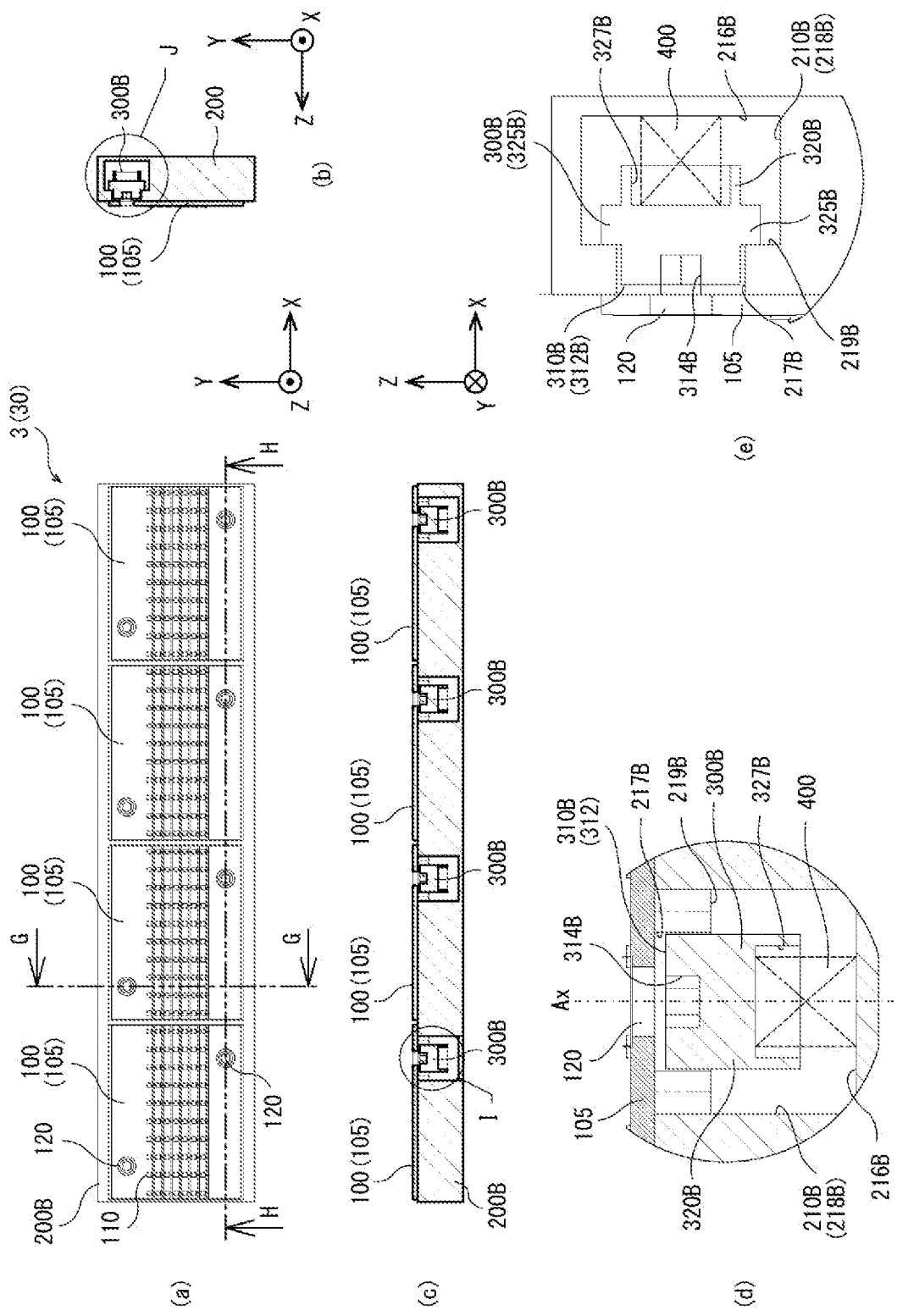
FIG. 5 is a view for explaining a schematic configuration of a light emitting device having a circuit board supporting structure according to a third exemplary embodiment of the present disclosure.
Figure 6:
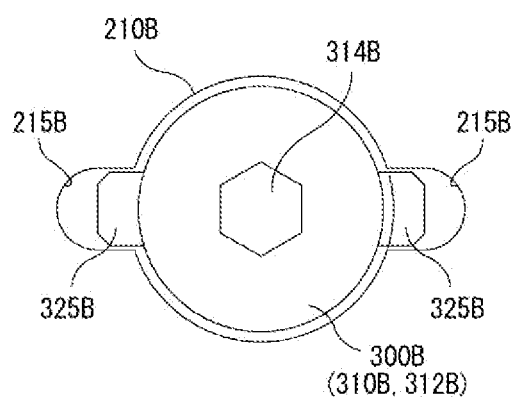
FIG. 6 is a top plan view illustrating a state in which a rotational operation member of the circuit board supporting structure according to the third exemplary embodiment of the present disclosure is mounted.

FIG. 5 is a view for explaining a schematic configuration of a light emitting device 3 having a circuit board supporting structure 30 according to a third exemplary embodiment of the present disclosure, in which FIG. 5A is a front view, FIG. 5B is a cross-sectional view taken along line G-G in FIG. 5A, FIG. 5C is a cross-sectional view taken along line H-H in FIG. 5A, FIG. 5D is an enlarged view of part I in FIG. 5C, and FIG. 5E is an enlarged view of part J in FIG. 5B. In addition, FIG. 6 is a top plan view illustrating a state in which a rotational operation member 300B of the present exemplary embodiment is mounted in a concave portion 210B. In addition, FIG. 7 is a perspective view for explaining a configuration of the rotational operation member 300B of the present exemplary embodiment.

Figure 7:
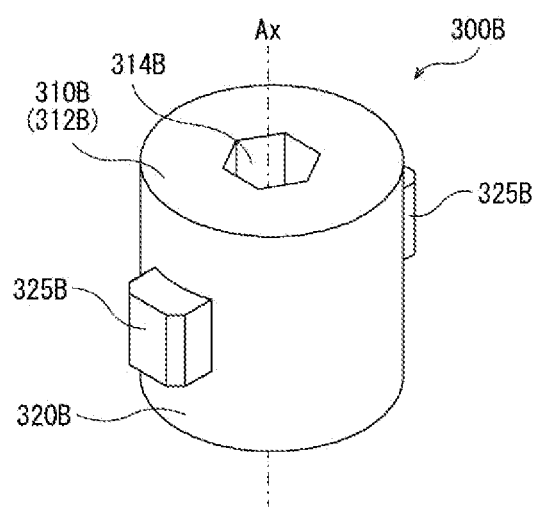
FIG. 7 is a perspective view for explaining a configuration of the rotational operation member of the circuit board supporting structure according to the third exemplary embodiment of the present disclosure.

As illustrated in FIGS. 5, 6, and 7, the circuit board supporting structure 30 of the present exemplary embodiment differs from the circuit board supporting structure 10 of the first exemplary embodiment in that a shape of the rotational operation member 300B and the concave portion 210B of a heat sink 200B differ from the shape of the rotational operation member 300 and the concave portion 210 of the heat sink 200 of the first exemplary embodiment, and a compressive spring 400 configured to bias the rotational operation member 300B in the Z-axis direction is provided.

The rotational operation member 300B of the present exemplary embodiment is a columnar member made of metal and configured to be accommodated in the concave portion 210B of the heat sink 200B. Like the rotational operation member 300 of the first exemplary embodiment, the rotational operation member 300B is configured to extend and retract in a direction (i.e., the Z-axis direction) perpendicular to the surface of the heat sink 200B by rotating about the rotational axis Ax extending in the Z-axis direction. At an end surface 310B (head portion) in the Z-axis direction of the rotational operation member 300B, a reference surface 312B is formed approximately in parallel with the surface of the heat sink 200B, and a tool hole 314A (operation portion) is formed. In addition, a pair of protruding portions 325B, which protrude in opposite directions, is formed at an approximately central portion in the Z-axis direction of a cylindrical surface (body portion) 320B of the rotational operation member 300B. In addition, a concave portion 327B configured to accommodate the compressive spring 400 is formed at an end of the rotational operation member 300B in a direction opposite to the Z-axis direction.

In addition, in the concave portion 210B of the heat sink 200B of the present exemplary embodiment, a small diameter portion 217B having an inner diameter slightly greater than an outer diameter of the cylindrical surface 320B of the rotational operation member 300B is formed, a large diameter portion 218B having an inner diameter greater than the small diameter portion 217B is formed, and a bottom surface 216B adjoining one end of the compressive spring 400 are formed (FIGS. 5D and 5E). In addition, a pair of groove portions 215B, which engages with the protruding portions 325B of the rotational operation member 300B (i.e., through which the protruding portions 325B pass) when the rotational operation member 300B is mounted in the concave portion 210B, is formed in the concave portion 210B (FIG. 6).

When the rotational operation member 300B of the present exemplary embodiment is mounted in the concave portion 210B of the heat sink 200B, the protruding portion 325B of the rotational operation member 300B is positioned and disposed in the groove portion 215B of the heat sink 200B in the state in which one end of the compressive spring 400 is mounted in the concave portion 327B, and the rotational operation member 300B is press-fitted into the concave portion 210B (FIG. 6). When the rotational operation member 300B is press-fitted into the concave portion 210B, the protruding portion 325B slides in the state in which the protruding portion 325B engages with the groove portion 215B, and one end of the compressive spring 400 comes into contact with the bottom surface 216B, such that the compressive spring 400 is compressed. When the compressive spring 400 is sufficiently compressed, the protruding portion 325B deviates from the groove portion 215B and is positioned in the large diameter portion 218B. Further, when the rotational operation member 300B is rotated to release the pressure in this state (the state in which the rotational operation member 300B is press-fitted into the concave portion 210B), the protruding portion 325B engages with a stepped portion 219B between the small diameter portion 217B and the large diameter portion 218B and is biased in the Z-axis direction by the compressive spring 400, such that the rotational operation member 300B is fixed in the concave portion 210B of the heat sink 200B. Further, when the rotational operation member 300B is mounted in the concave portion 210B, the reference surface 312A is positioned on approximately the same plane as the surface (placement surface) of the heat sink 200B or slightly recessed from the surface of the heat sink 200B (first state) (FIGS. 5D and 5E). In this way, the light emitting device 3 of the present exemplary embodiment is assembled in the state in which the rotational operation member 300B is mounted in the concave portion 210B. That is, the heat sink 200B, in which the rotational operation member 300B is mounted in the concave portion 210B, is prepared, the thermal grease is applied onto the surface (placement surface) of the heat sink 200B, and the respective LED modules 100 are mounted on the heat sink 200B and fixed by a non-illustrated fixing member (e.g., a screw or the like). When the LED modules 100 are mounted on the heat sink 200B, the through hole 120 of each of the boards 105 is disposed above (at a side in the Z-axis direction of) each of the concave portions 210B of the heat sink 200B, and a tool hole 314B of the rotational operation member 300B is exposed from the through hole 120. Further, in the present exemplary embodiment, the diameter of the through hole 120 is smaller than the diameter of the small diameter portion 217B of the concave portion 210B and an outer diameter of a cylindrical surface 320B of the rotational operation member 300B.

Further, after the light emitting device 3 begins to be used, for example, in the case in which the process of changing the LED module 100 needs to be performed in the event of a failure of the LED element 110, the non-illustrated fixing member (e.g., a screw or the like), which fixes the respective LED modules 100, is detached, the tool (e.g., a screw driver or the like) is inserted into the through hole 120, and the tip of the tool is fitted into the tool hole 314B of the rotational operation member 300B. Further, the rotational operation member 300B is rotated, such that the protruding portion 325B engages with the groove portion 215B. When the protruding portion 325B engages with the groove portion 215B, the rotational operation member 300B is slid (moved) in the Z-axis direction by biasing force of the compressive spring 400. When the rotational operation member 300B is moved in the Z-axis direction, the reference surface 312B of the rotational operation member 300B comes into contact with the rear surface of the board 105, and the reference surface 312B further protrudes than the surface (placement surface) of the heat sink 200B (second state). Further, because stress in the Z-axis direction is applied to the board 105 when the reference surface 312B further protrudes than the surface (placement surface) of the heat sink 200B, the board 105 is raised from the heat sink 200B. That is, because the board 105 is lifted from the heat sink 200B, the LED module 100 may be easily changed.

In this way, in the present exemplary embodiment, the rotational operation member 300B is accommodated in the concave portion 210B of the heat sink 200B, and as the rotational operation member 300B is rotated about the rotational axis Ax, the reference surface 312B is positioned on approximately the same plane as the surface (placement surface) of the heat sink 200B or moved between the state (first state) in which the reference surface is further recessed than the surface of the heat sink 200B and the state (second state) in which the reference surface 312B further protrudes than the surface (placement surface) of the heat sink 200B, such that the board 105 is raised from the heat sink 200B, and as a result, the LED module 100 may be easily changed.

Further, the exemplary embodiments disclosed herein are illustrative in all aspects and do not limit the present disclosure. The scope of the present disclosure is defined by the claims instead of the above-mentioned descriptions, and all modifications within the equivalent scope and meanings to the claims belong to the scope of the present disclosure.

The invention claimed is:

1. A circuit board supporting structure configured to support a circuit board on a base,
wherein the base has a concave portion formed in a placement surface of the circuit board, and a rotational operation member configured to be rotatably accommodated in the concave portion and extend and retract in a direction perpendicular to the placement surface by a rotational operation,
wherein the circuit board has a through hole formed at a position corresponding to the concave portion,
wherein the rotational operation member has a reference surface formed approximately in parallel with the placement surface, and an operation portion formed on a rotational axis of the rotational operation member so as to be exposed from the through hole,
wherein by the rotational operation toward the operation portion, the reference surface is positioned on approximately a same plane as the placement surface or moved between a first state in which the reference surface is further recessed than the placement surface and a second state in which the reference surface further protrudes than the placement surface, and
wherein when the rotational operation member moves from the first state to the second state, the reference surface comes into contact with the circuit board and applies a stress in a vertical direction to the circuit board.

2. The circuit board supporting structure according to claim 1, wherein the operation portion is formed on approximately the same plane as the reference surface.

3. The circuit board supporting structure according to claim 1, wherein the rotational operation member has a head portion having the reference surface and the operation portion, and a body portion configured to engage with or be thread-coupled to the concave portion.

4. The circuit board supporting structure according to claim 2, wherein the rotational operation member has a head portion having the reference surface and the operation portion, and a body portion configured to engage with or be thread-coupled to the concave portion.

5. The circuit board supporting structure according to claim 3, wherein the head portion has a protruding portion that protrudes from the reference surface along a rotational axis of the rotational operation member, and the protruding portion is fitted with the through hole.

6. The circuit board supporting structure according to claim 5, wherein the operation portion is formed at a tip of the protruding portion.

7. The circuit board supporting structure according to claim 1, wherein the rotational operation member has a compressive spring configured to bias the circuit board in a direction perpendicular to the reference surface in the second state.

8. The circuit board supporting structure according to claim 2, wherein the rotational operation member has a compressive spring configured to bias the circuit board in a direction perpendicular to the reference surface in the second state.

9. The circuit board supporting structure according to claim 3, wherein the rotational operation member has a compressive spring configured to bias the circuit board in a direction perpendicular to the reference surface in the second state.

10. The circuit board supporting structure according to claim 4, wherein the rotational operation member has a compressive spring configured to bias the circuit board in a direction perpendicular to the reference surface in the second state.

11. The circuit board supporting structure according to claim 5, wherein the rotational operation member has a compressive spring configured to bias the circuit board in a direction perpendicular to the reference surface in the second state.

12. The circuit board supporting structure according to claim 6, wherein the rotational operation member has a compressive spring configured to bias the circuit board in a direction perpendicular to the reference surface in the second state.

13. The circuit board supporting structure according to claim 1, wherein the base is a heat sink configured to cool the circuit board.

14. The circuit board supporting structure according to claim 2, wherein the base is a heat sink configured to cool the circuit board.

15. The circuit board supporting structure according to claim 3, wherein the base is a heat sink configured to cool the circuit board.

16. The circuit board supporting structure according to claim 5, wherein the base is a heat sink configured to cool the circuit board.

17. The circuit board supporting structure according to claim 6, wherein the base is a heat sink configured to cool the circuit board.

18. The circuit board supporting structure according to claim 7, wherein the base is a heat sink configured to cool the circuit board.

19. A light emitting device comprising: the circuit board supporting structure according to claim 1; and multiple light emitting elements disposed on the circuit board.

20. The light emitting device according to claim 19, wherein light emitted from the light emitting element is light having a wavelength in an ultraviolet region.

\* \* \* \* \*